United States Patent [19]
Chien et al.

[11] Patent Number: 6,010,942
[45] Date of Patent: Jan. 4, 2000

[54] POST CHEMICAL MECHANICAL POLISHING, CLEAN PROCEDURE, USED FOR FABRICATION OF A CROWN SHAPED CAPACITOR STRUCTURE

[75] Inventors: Rong-Wu Chien; Hsiao-Chiu Tuan; Chao-Ming Koh; Tung Chia Ching, all of Hsin-Chu, Taiwan

[73] Assignee: Vanguard International Semiconductor Corporation, Hsin-Chu, Taiwan

[21] Appl. No.: 09/318,959

[22] Filed: May 26, 1999

[51] Int. Cl.[7] ...................................................... H01L 21/20
[52] U.S. Cl. ........................... 438/396; 438/398; 438/255
[58] Field of Search ..................................... 438/253, 254, 438/255, 256, 396, 397, 398, 399

[56] References Cited

U.S. PATENT DOCUMENTS

| 5,597,756 | 1/1997 | Fazan et al. | |
|---|---|---|---|
| 5,677,227 | 10/1997 | Yang et al. | |
| 5,763,306 | 6/1998 | Tsai | 438/255 |
| 5,895,250 | 4/1999 | Wu | 438/253 |
| 5,913,119 | 6/1999 | Lin et al. | 438/253 |
| 5,943,582 | 8/1999 | Huang et al. | 438/253 |

*Primary Examiner*—Tuan H. Nguyen
*Attorney, Agent, or Firm*—George O. Saile; Stephen B. Ackerman

[57] ABSTRACT

A process for forming a DRAM capacitor structure, comprised with a HSG silicon/polysilicon crown shaped storage node structure, has been developed. The process features the use of a series of wet clean procedures, used to prepare the surface of the HSG silicon/polysilicon, crown shaped storage node structure, for the formation of an overlying capacitor dielectric layer. A first wet clean procedure is employed after the formation of the crown shaped storage node structure via a CMP procedure, featuring an ammonium hydroxide—hydrogen peroxide solution, used to remove CMP, as well as HSG silicon particles from the surface of a photoresist plug used for definition of the crown shaped storage node structure. Another wet clean procedure, first performed in a DHF solution, then followed by a sulfuric acid—hydrogen peroxide treatment, is used to prepare the HSG silicon/polysilicon, crown shaped storage node structure, for formation of the overlying capacitor dielectric layer.

16 Claims, 5 Drawing Sheets

POST CHEMICAL MECHANICAL POLISHING, CLEAN PROCEDURE, USED FOR FABRICATION OF A CROWN SHAPED CAPACITOR STRUCTURE

BACKGROUND OF THE INVENTION (1) Field of the Invention

The present invention relates to methods used to fabricate semiconductor devices, and more specifically to a method used to create a crown shaped, capacitor structure, for a dynamic random access memory, (DRAM), device.

(2) Description of Prior Art

The semiconductor industry is continually striving to increase device performance. The performance, or strength of signal, of a DRAM device, is strongly dependent on the capacitor structure, used for the DRAM device. The design often used for DRAM capacitors, is a stacked capacitor configuration, comprised with the stacked capacitor structure, overlying a transfer gate transistor, communicating with the underlying transfer gate transistor, via a connecting storage node structure. However the trend to micro-miniaturization, or the use of sub-micron features, have resulted in a reduction in the horizontal dimension, allotted for a specific transfer gate transistor, thus the dimension of an overlying stacked capacitor structure, is now limited. Therefore capacitance increases, needed for enhanced performance, can not be achieved via increasing the horizontal dimension of the stacked capacitor structure.

The solution for increasing DRAM capacitance, while still deceasing the horizontal dimension of the transfer gate transistor, or of the DRAM cell, has been successfully addressed, via use of either a crown shaped, capacitor structure, and/or the use of a hemispherical grain, (HSG), silicon layer, used as the top surface of the storage node component of the capacitor structure. The crown shaped, capacitor structure, featuring a crown shaped storage node structure, comprised of vertical, as well as horizontal features, increases. the surface area of the storage node structure as a result of the vertical features. Yang et al, in U.S. Pat. No. 5,677,227, describe crown shaped capacitor structures, comprised with numerous polysilicon features, offering increased storage node surface area, and thus increased capacitance when compared to counterparts fabricated using flat storage node shapes. The use of an HSG silicon layer, on the top surface of a storage node structure, increases surface area via the convex and concave features of the HSG silicon layer. Tsai, in U.S. Pat. No. 5,763,306, describes a method for fabricating a capacitor structure, featuring an HSG silicon layer, on the top surface of a storage node shape. In addition, capacitor structures have been fabricating using the combination of an HSG silicon layer, on the top surface of a crown shaped, storage node structure, offering increased surface area via use of both approaches.

The fabrication of a crown shaped storage node structure, is accomplished via formation of a capacitor opening, in an insulator layer; depositing an HSG silicon/ polysilicon layer; followed by the removal of the regions of the HSG silicon/polysilicon layer, residing on the top surface of the insulator layer, resulting in the desired crown shaped, storage node shape, in the capacitor opening, comprised of vertical HSG silicon/polysilicon features, on the sides of the capacitor opening, and a horizontal, HSG silicon/polysilicon feature, at the bottom of the capacitor opening, connecting the vertical HSG silicon/polysilicon features. The removal of the HSG silicon/polysilicon regions, from the top surface of the insulator layer is accomplished via a chemical mechanical polishing, (CMP), procedure, used to remove the desired regions of HSG silicon/polysilicon, without disturbing the HSG silicon/polysilicon horizontal feature, located at the bottom of the capacitor opening. However the CMP, used is this situation, can place unwanted particles, either from the CMP slurry, of from the removed HSG/polysilicon layer, at the bottom of the capacitor opening, overlying the horizontal HSG silicon/polysilicon, component, and interfering with the subsequent formation of an overlying capacitor dielectric layer. The use of a photoresist plug, located in the capacitor opening, only exposing the regions of HSG silicon/polysilicon, located on the top surface of the insulator layer, results in the same particles, now formed on the top surface of the photoresist plug, instead of being located at the bottom of the capacitor opening. However selective removal of the photoresist plug, via plasma oxygen ashing, results in the non-volatilized particles, falling into the bottom of the capacitor opening, again adversely influencing the subsequent formation of the capacitor dielectric layer.

This invention will offer a procedure for fabricating HSG silicon/polysilicon, crown shaped storage node structures, in which the particles presented by the needed CMP procedure, is successfully addressed. A first wet procedure, using a solution of $NH_4OH$ and $H_2O_2$, is used to remove the unwanted particles, from the top surface of a photoresist plug, after the CMP procedure, and prior to removal of the photoresist plug. Next a $H_2SO_4$ and $H_2O_2$ solution is employed to clean the HSG silicon surface, prior to the formation of an overlying capacitor dielectric layer. These novel wet clean procedures, at these specific process stages. have not been offered in any of the prior art addressing crown shaped, as well as HSG silicon, capacitor structures.

SUMMARY OF THE INVENTION

It is an object of this invention to fabricate a crown shaped capacitor structure, for a DRAM device, featuring an HSG silicon/polysilicon, crown shaped storage node structure.

It is another object of this invention to use a CMP procedure, to remove regions of an HSG silicon/polysilicon, composite layer, from a top surface of the insulator layer in which the capacitor opening was formed in, to create the HSG silicon/polysilicon, crown shaped storage node structure, in the capacitor opening.

It is still another object of this invention to remove CMP slurry particles, as well as HSG silicon particles, via a first wet chemical clean procedure, from the top surface of a photoresist plug, located in the capacitor opening, used to protect the HSG silicon/polysilicon horizontal feature, residing at the bottom of the capacitor opening, form the CMP procedure.

It is still yet another object of this invention to perform a second wet chemical clean procedure, on the exposed top surface of the HSG silicon/polysilicon, crown shaped storage node structure, prior to formation of an capacitor dielectric layer.

In accordance with the present invention a method of fabricating a crown shaped capacitor structure, for a DRAM device, comprised with an HSG silicon/polysilicon, crown shaped storage node structure, and featuring a series of wet chemical clean procedures, performed to the HSG silicon/polysilicon, crown shaped storage node structure, to improve the quality of an overlying capacitor dielectric layer, is described. A transfer gate transistor is formed, comprised of a polysilicon gate structure, on a gate insulator layer, featuring insulator spacers on the sides of the polysilicon gate structure, and source/drain regions, self-aligned to the polysilicon gate structure. After formation of a storage node contact hole, in a first insulator layer, exposing the top surface of a source region, a storage node plug structure, is formed in the storage node contact hole. A capacitor opening is then formed in an overlying, second insulator layer, exposing the top surface of the storage node plug structure. After deposition of a composite HSG silicon/polysilicon layer, on the exposed surfaces of the capacitor opening, as well as on the top surface of the second insulator layer, a photoresist plug is formed in the capacitor opening, completely covering the regions of the HSG silicon/polysilicon layer, residing on the surfaces of the capacitor opening. A CMP procedure is then employed to remove regions of the HSG silicon/polysilicon layer, from the top surface of the second insulator layer, creating a HSG silicon/polysilicon, crown shaped storage node structure, in the capacitor opening. A first wet chemical procedure, using a solution of $NH_4OH$ and $H_2O_2$, is used to remove CMP slurry, and HSG silicon particles, form the top surface of the photoresist plug, followed by removal of the photoresist plug. A second wet clean procedure, first using a dilute hydrofluoric, (HF), acid, followed by a solution comprised of $H_2SO_4$, and $H_2O_2$, is then used to prepare the surface of the HSG silicon/polysilicon, crown shaped storage node structure, for an overlying capacitor dielectric layer, The dilute HF component, of the second wet clean procedure, results in etchback, or thinning of exposed second insulator layer. After formation of the capacitor dielectric layer, on the exposed surfaces of the HSG silicon/polysilicon, crown shaped storage node structure, a polysilicon upper plate is formed on the underlying capacitor dielectric layer, completing the formation of the crown shaped capacitor structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
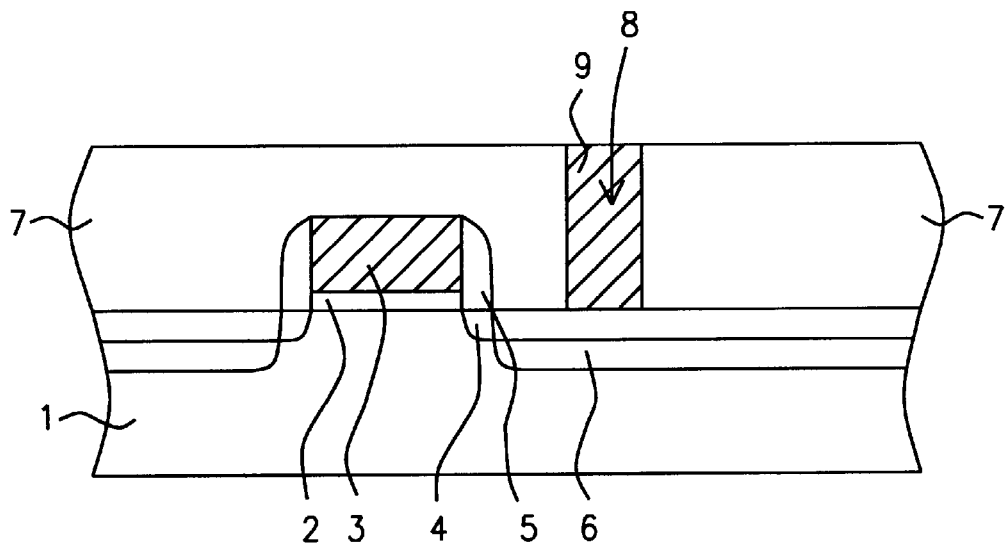
FIGS. 1–9, which schematically. In cross-sectional, style, shows the key stages of fabrication used to create the DRAM capacitor structure, comprised with a HSG silicon/polysilicon, crown shaped storage node structure.

The method of fabricating a crown shaped capacitor structure, for a DRAM device, featuring an HSG silicon/polysilicon, crown shaped storage node structure, which is formed using a series of wet clean procedures, prior to formation of an overlying capacitor dielectric layer, will now be described in detail. The transfer gate transistor used in this invention is a N channel device, however this invention can also used with P channel, transfer gate transistors. A P type, semiconductor substrate 1, comprised of single crystalline silicon, with a <100> crystallographic orientation, is used and shown schematically in FIG. 1. A gate insulator layer 2, comprised of silicon dioxide, at a thickness between about 50 to 200 Angstroms, is formed via thermal oxidation procedures, in an oxygen-steam ambient. A polysilicon layer is next deposited, via low pressure chemical vapor deposition, (LPCVD), procedures, at a thickness between about 500 to 2000 Angstroms, and either doped in situ, during deposition, via the addition of arsine, or phosphine, to a silane ambient, or deposited intrinsically, than doped via ion implantation procedures, using arsenic or phosphorous ions. Conventional photolithographic and anisotropic reactive ion etching, (RIE), procedures, using $Cl_2$ as an etchant for polysilicon, are used to create polysilicon gate structure 3, schematically shown in FIG. 1. The photoresist shape, used to define polysilicon gate structure 3, is removed via plasma oxygen ashing, and careful wet clean procedures. The wet clean procedures, also removes the region of gate insulator 2, not covered by polysilicon gate structure 3. Lightly doped source/drain region 4, is next formed, self-aligned to polysilicon gate structure 3, via ion implantation procedures, of arsenic or phosphorous ions, at an energy between about 10 to 50 KeV, at a dose between about 1E12 to 1E14 atoms/$cm^2$. A deposition of either silicon oxide, or silicon nitride, is next performed, via LPCVD or plasma enhanced chemical vapor deposition, (PECVD), procedures, at a thickness between about 200 to 1000 Angstroms, followed by an anisotropic RIE procedure using $CHF_3$ or $CF_4$ as an etchant, to create insulator spacers 5, on the sides of polysilicon gate structure 3. Heavily doped source/drain region 6, shown schematically in FIG. 1, is then formed, self-aligned to the insulator spacers, on polysilicon gate structure 3, via ion implantation of arsenic or phosphorous ions, at an energy between about 20 to 50 KeV, at a dose between about 1E14 to 1E16 atoms/$cm^2$.

First insulator layer 7, comprised of either a silicon oxide layer, or a borophosphosilicate glass, (BPSG), layer, is next deposited, via LPCVD or PECVD procedures, at a thickness between about 3000 to 10000 Angstroms. A chemical mechanical polishing procedure is employed for planarization purposes, resulting in a smooth top surface topography for insulator layer 7. This is schematically shown in FIG. 1. Conventional photolithographic and anisotropic RIE procedures, using $CHF_3$ as an etchant, are used to form storage node contact hole 8, in insulator 7, exposing a portion of the top surface of heavily doped source/drain region 6. After removal of the photoresist shape, used for definition of storage node contact hole 8, via plasma oxygen ashing and careful wet cleans, a polysilicon layer is deposited, via LPCVD procedures, to a thickness between about 2000 to 6000 Angstroms, completely filling storage node contact hole 8. The polysilicon layer is doped in situ, during deposition via the addition of arsine, or phosphine, to a silane ambient. Removal of regions of the polysilicon layer, overlying the top surface of first insulator layer 7. is accomplished via a CMP procedure, or via a selective RIE procedure, using $Cl_2$ as an etchant, creating storage node plug structure 9, in storage node contact hole 8, overlying and contacting a top portion of heavily doped source/drain region 6. This is schematically shown in FIG. 1.

Figure 2:
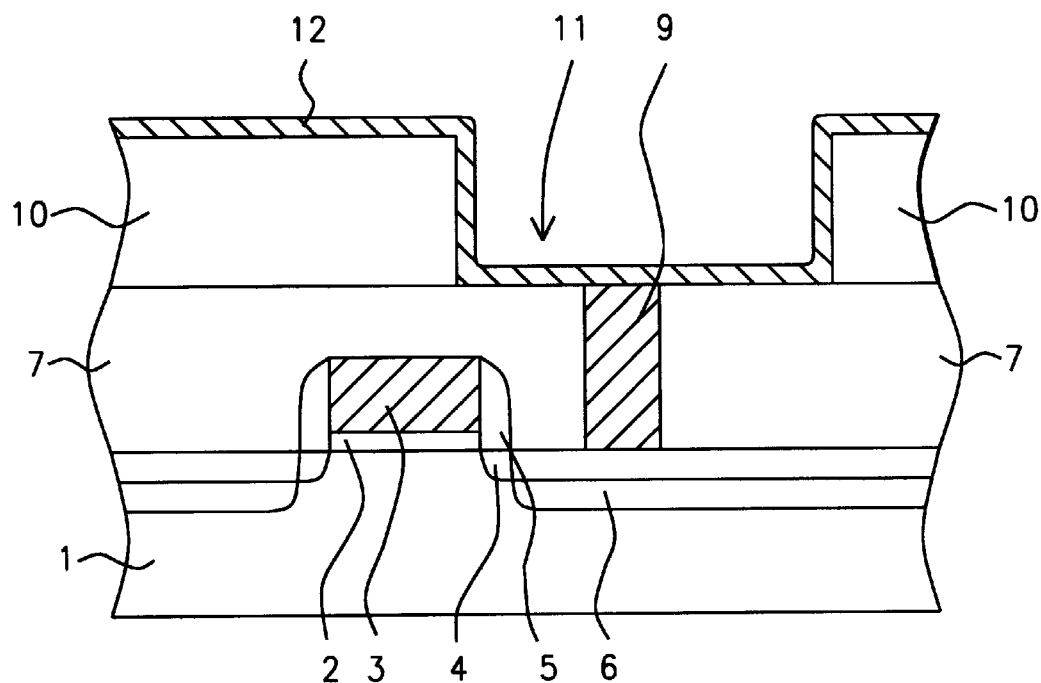
Figure 3:
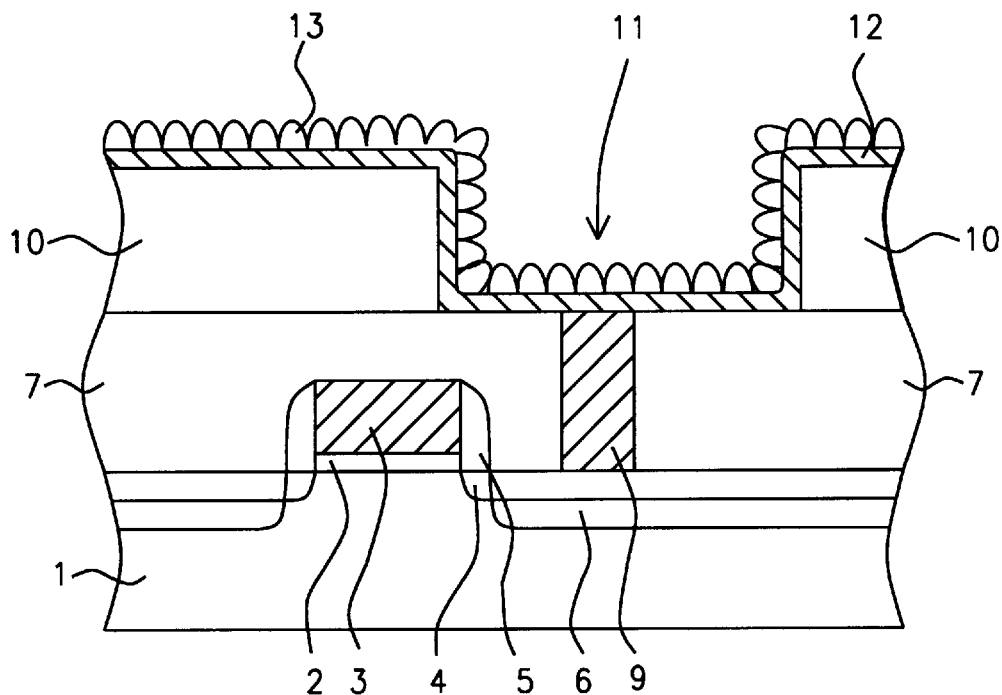

A second insulator layer 10, comprised of silicon oxide, is next deposited to a thickness between about 9000 to 15000 Angstroms, via LPCVD or PECVD procedures. Conventional photolithographic and RIE procedures, using $CHF_3$ as an etchant, are then used to form capacitor opening 11, in second insulator layer 10, exposing the top surface of storage node plug structure 9. This is schematically shown in FIG. 2. After removal of the photoresist shape, used for definition of capacitor opening 11, via plasma oxygen ashing and careful wet cleans, polysilicon layer 12, is deposited, via LPCVD procedures, to a thickness between about 300 to 1000 Angstroms. Polysilicon layer 12, shown schematically in FIG. 2, residing on the top surface of second insulator layer 2, and on all surfaces of capacitor opening 11, is doped in situ, during deposition, via the addition of arsine, or phosphine, to a silane ambient. FIG. 3, schematically shows the formation of HSG silicon layer 13, on polysilicon layer 12. HSG silicon layer 13, is formed via initially depositing an HSG silicon seed layer, at a temperature between about 500 to 600° C. The resulting HSG silicon layer 13, exhibits the convex and concave features, needed to increase the surface area of the subsequent storage node structure.

Figure 4:
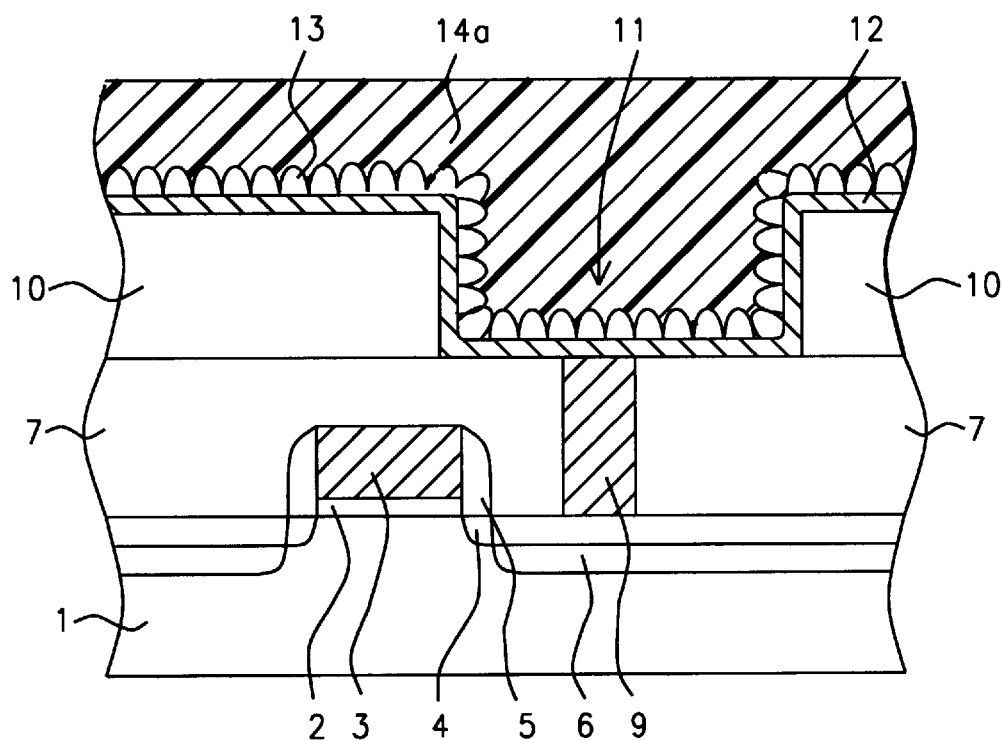
Figure 5:
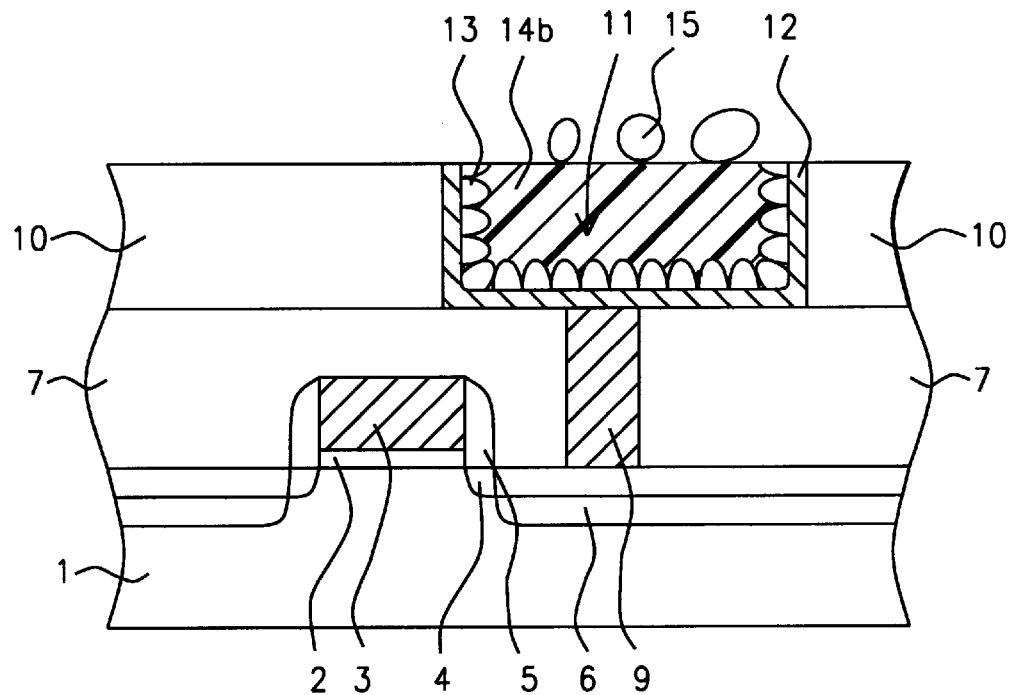

The definition of the HSG silicon/polysilicon, crown shaped storage node structure, is next addressed, and described schematically using FIGS. 4–8. A photoresist layer 14a, is first applied, completely filling capacitor opening 11. This is schematically shown in FIG. 4. Regions of photoresist layer 14a, are removed from the top surface of second insulator layer 10, either via a CMP procedure, via a selective RIE procedure, using $O_2$ as an etchant, or via a photolithographic exposure and develop procedure, creating photoresist plug 14b, in capacitor opening 11. A CMP procedure is next used to remove the regions of HSG silicon/polysilicon, not protected by photoresist plug 14b, from the top surface of second insulator 10, resulting in the HSG silicon/polysilicon crown shaped storage node structure, residing in capacitor opening 11, protected from the CMP procedure by photoresist plug 14b. This is schematically shown in FIG. 5. Also shown in FIG. 5, are particles 15, comprised of either slurry from the CMP procedure, or comprised of HSG silicon residue, residing on the top surface of photoresist plug 14b. If photoresist plug 14b, were to be removed at this stage of process, particles 15, not soluble in the plasma oxygen, or wet clean procedures, used for photoresist removal, can relocate to the bottom of capacitor opening 11, overlying the horizontal HSG silicon/polysilicon component, of the crown shaped storage node structure, interfering with the subsequent formation of an overlying capacitor structure. It should also be noted that another iteration of forming the HSG silicon/polysilicon crowned shaped storage node structure, is to perform the CMP procedure, after application of the photoresist layer 14a, removing regions of photoresist layer 14a, as well as regions of the HSG silicon/polysilicon layer, from the top surface of second insulator layer 10, again resulting in photoresist plug 14b, in capacitor opening 11, with particles 15, still located on the top surface of photoresist plug 14b.

Figure 6:
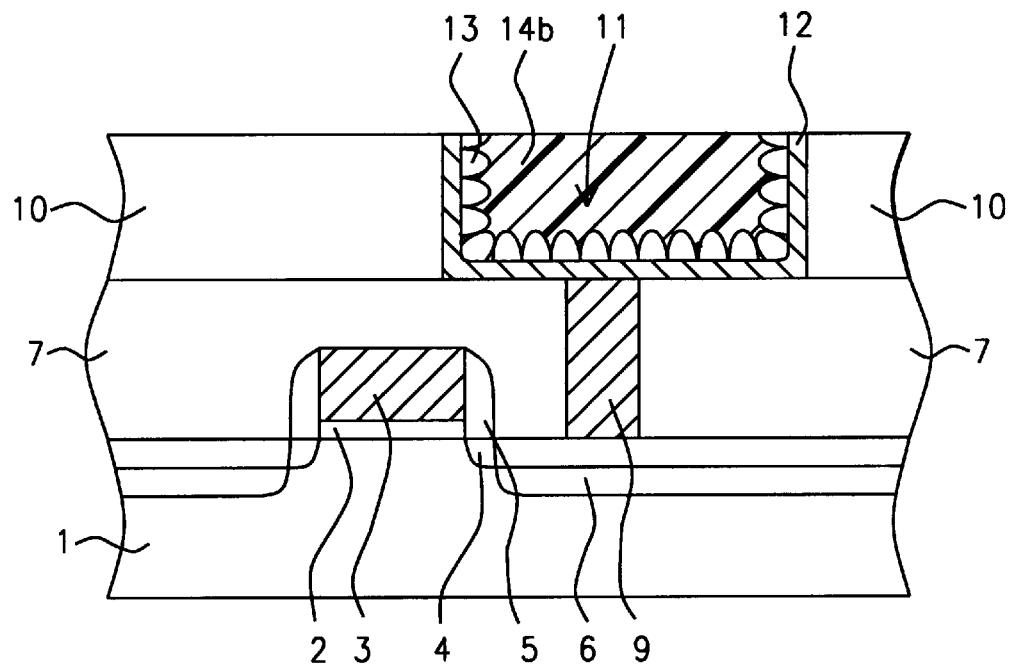
Figure 7:
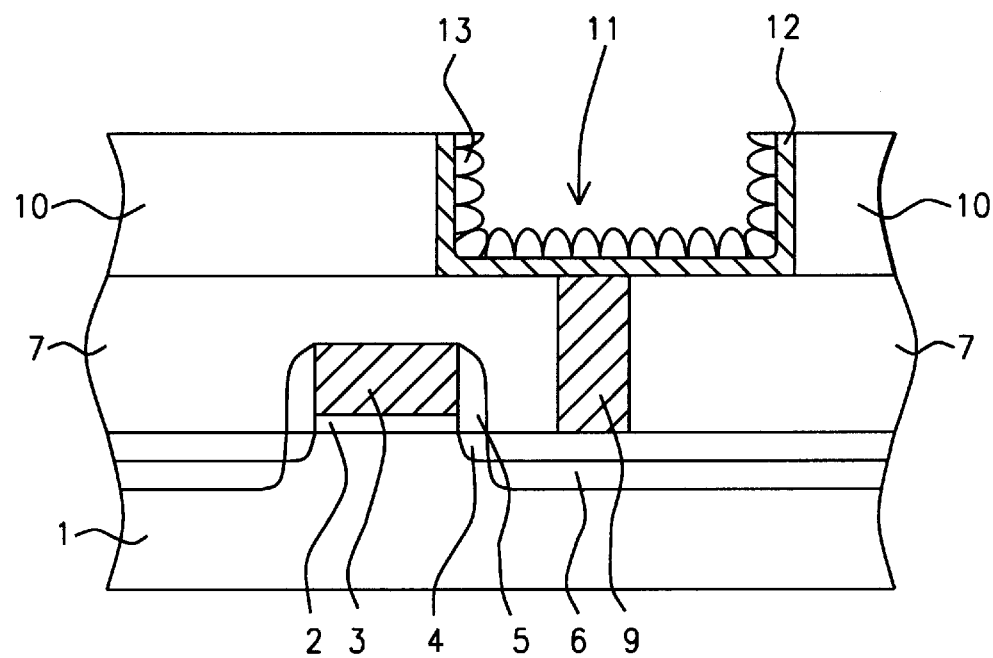
Figure 8:
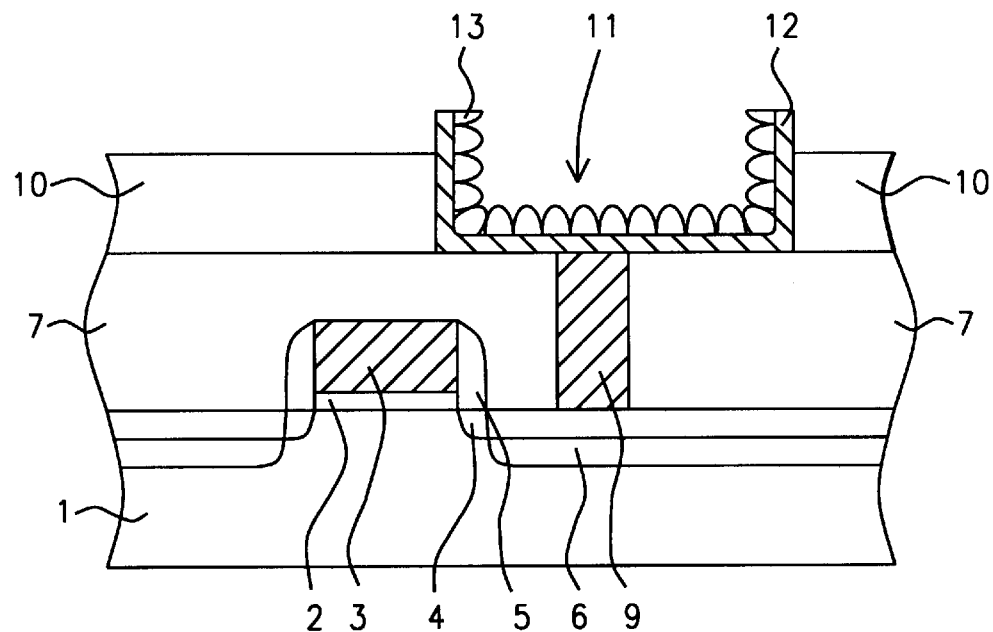

A method to remove particles 15, prior to the selective removal of photoresist plug 14b, is the use of a wet clean treatment of particles 15, in a solution of $NH_4OH$ and $H_2O_2$ at a temperature between about 70 to 80° C., for a time between about 1 to 10 min. This first wet clean treatment results in complete removal of particles 15, from the top surface of photoresist plug 14b. This is schematically shown in FIG. 6. Photoresist plug 14b, is next removed via plasma oxygen ashing procedures, as shown schematically in FIG. 7. A second wet clean treatment is next performed to prepare the surface of the HSG silicon/polysilicon, crown shaped storage node structure, for the formation of an overlying capacitor dielectric layer. The second wet clean treatment initiates with a dilute hydrofluoric acid, (DHF), dip, resulting in the recessing of second insulator 10, now at a thickness between about 1000 to 7000 Angstroms. The DHF solution, comprised of one part of a 50% solution of HF, in 100 parts of $H_2O$, is used to remove native oxide from the surface of the HSG silicon/polysilicon, crown shaped storage node structure, prior to a treatment in a solution comprised of $H_2SO_4$ and $H_2O_2$, at a temperature between about 120 to 180° C., for a time between about 1 to 10 min. The result of the second wet clean treatment, used for surface preparation for the formation of an overlying capacitor dielectric layer, accompanied by the recessing of second insulator layer 10, is shown schematically in FIG. 8.

Figure 9:
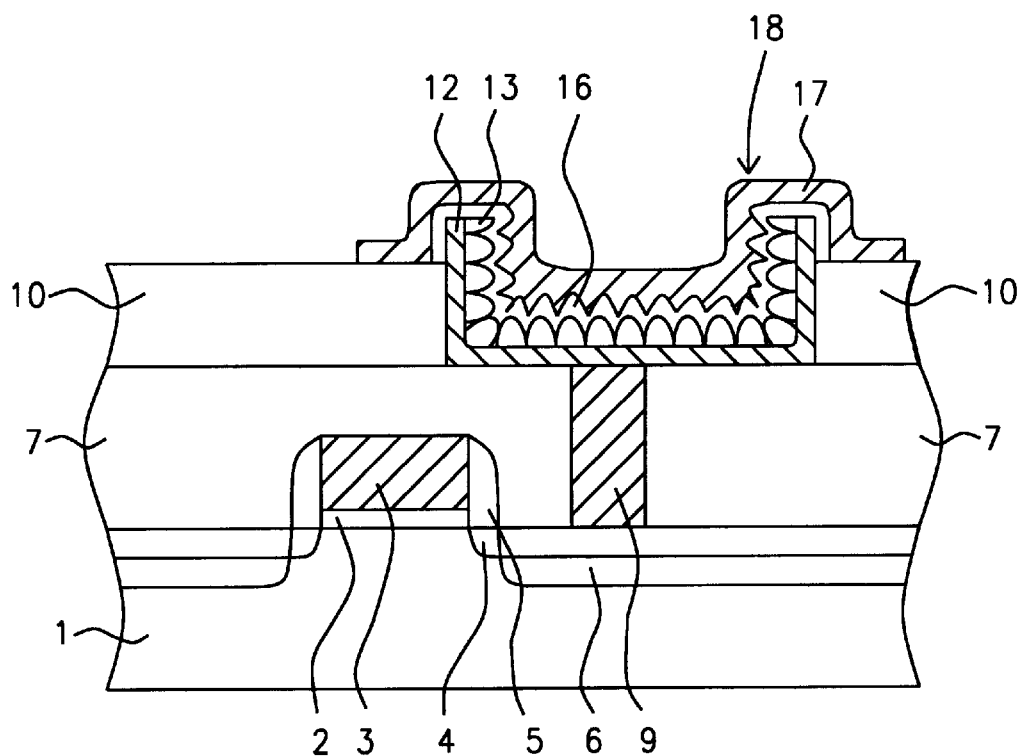

The completion of the DRAM capacitor structure, featuring an HSG silicon/polysilicon, crown shaped storage node structure, is next described, and shown schematically in FIG. 9. Capacitor dielectric layer 16, comprised of Oxidized Nitride on Oxide, (ONO), is formed on the exposed surfaces of the HSG silicon/polysilicon crown shaped storage node structure. This is accomplished by growing a silicon oxide layer, at a thickness between about 5 to 10 Angstroms, on the surface of HSG silicon layer 13, via subjection to a hot sulfuric acid solution, or via thermal oxidation procedures. Next a silicon nitride layer is deposited via LPCVD or PECVD procedures, at a thickness between about 40 to 60 Angstroms, followed by a thermal oxidation procedure, performed in an oxygen—steam ambient, at a temperature between about 800 to 850° C., converting a top portion of the silicon nitride layer, to a silicon oxide layer, and resulting in ONO layer 16, at an equivalent silicon oxide thickness between about 45 to 55 Angstroms, if desired other materials, such as tantalum oxide can be used as the capacitor dielectric layer. A polysilicon layer is next deposited via LPCVD procedures, at a thickness between about 500 to 2000 Angstroms, doped either in situ, during deposition via the addition of arsine, or phosphine, to a silane ambient, or deposited intrinsically, then doped via ion implantation of arsenic, or phosphorous ions. Conventional photolithographic, and anisotropic RIE procedures, using $Cl_2$ as an etchant, are used to create polysilicon top plate 17, shown schematically in FIG. 9, and completing the fabrication of DRAM, crown shaped capacitor structure 18, comprised of polysilicon top plate 17, capacitor dielectric layer 16, and the HSG silicon/polysilicon, crown shaped storage node structure.

While this invention has been particularly shown and described with reference to, the preferred embodiments thereof, it will be understood by those skilled in the art that various changes in form and details may be made without departing from the spirit or scope of this invention.

What is claimed is:

1. A method of fabricating a stacked capacitor structure, for a dynamic random access memory, (DRAM), device, on a semiconductor substrate, comprising the steps of:

providing a transfer gate transistor, comprised of a gate structure, on an underlying gate insulator layer, with insulator spacers located on the sides of said gate structure, and with a source/drain region, located in an area of said semiconductor substrate, not covered by said gate structure, or by said insulator spacers;

forming a storage node plug structure, in a storage node contact hole in a first insulator layer, with said storage node plug contacting a source region, of said transfer gate transistor, at the bottom of said storage node contact hole;

forming an opening in a second insulator layer, exposing the top surface of said storage node plug structure;

depositing a composite layer, comprised of an underlying first polysilicon layer, and an overlying hemispherical grain, (HSG), layer, on the sides of, and at the bottom of, said opening, in said second insulator layer, and on the top surface of said second insulator layer;

forming a photoresist plug, in said opening, in said second insulator layer, with said photoresist plug completely covering a first portion of said composite layer, located in said opening, in said second insulator layer, while a second portion of said composite layer, remains exposed on the top surface of said second insulator layer;

removing said second portion of said composite layer, from top surface of said second insulator layer, resulting in the formation of a crown shaped storage node structure, located in said opening, in said second insulator layer, comprised of said composite layer;

performing a first wet clean procedure;

removing said photoresist plug;

performing a second wet clean procedure, resulting in a recess of said second insulator layer;

forming a capacitor dielectric layer on the top surface of said crown shaped storage node structure; and forming a polysilicon top plate structure, on said capacitor dielectric layer, creating said stacked capacitor structure, comprised of overlying said polysilicon top plate, said capacitor dielectric layer, and underlying, said crown shaped storage node structure.

2. The method of claim 1, wherein said first insulator layer is a silicon oxide layer, obtained via LPCVD or PECVD procedures, at a thickness between about 3000 to 10000 Angstroms.

3. The method of claim 1, wherein said storage node plug structure, is formed from a polysilicon layer, obtained via LPCVD procedures, at a thickness between about 2000 to 6000 Angstroms, and doped in situ, during deposition, via the addition of arsine, or phosphine, to a silane ambient.

4. The method of claim 1, wherein said second insulator layer is a silicon oxide layer, obtained via LPCVD or PECVD procedures, at a thickness between about 9000 to 15000 Angstroms.

5. The method of claim 1, wherein said first wet clean procedure is performed using a solution comprised of $NH_4OH$ and $H_2O_2$, at a temperature between about 70 to 80° C., for a time between about 1 to 10 min.

6. The method of claim 1, wherein said second wet clean procedure is performed using an initial dilute hydrofluoric, (DHF), solution, comprised of: 1 part of a 50% HF solution, in 100 parts $H_2O$, followed by use of a $H_2SO_4$ and $H_2O_2$ solution, at a temperature between about 120 to 180° C.

7. The method of claim 1, wherein said second insulator is recessed during said second wet clean procedure, to a thickness between about 1000 to 7000 Angstroms.

8. The method of claim 1, wherein said capacitor dielectric layer is an ONO, (Oxidized Nitride on Oxide), layer, at an equivalent silicon oxide thickness between about 45 to 55 Angstroms.

9. A method of forming a crown shaped, stacked capacitor structure, for a DRAM device, on a semiconductor substrate, featuring a series of wet clean procedures, performed to a crown shaped, storage node structure, prior to the formation of an overlying capacitor dielectric layer, comprising the steps of:

providing a transfer gate transistor comprised of a gate structure, on an underlying gate insulator layer, with insulator spacers on the sides of said gate structure, and with a source/drain region, in an area of said semiconductor substrate, not covered by said gate structure;

depositing a first insulator layer;

planarizing said first insulator layer;

forming a storage node contact hole, in said first insulator layer, exposing a portion of the top surface of a source region component, of said source/drain region;

forming a polysilicon storage node structure, in said storage node contact hole;

depositing a second insulator layer;

forming a capacitor opening, in said second insulator layer, exposing the top surface of said polysilicon storage node structure;

depositing a first polysilicon layer, on the top surface of said second insulator layer, and on all the exposed surfaces, the sides of, as well as the bottom of, said capacitor opening;

forming an HSG silicon layer on underlying first polysilicon layer;

forming a photoresist plug in said capacitor opening, completely covering the regions of said HSG silicon layer, located in said capacitor opening;

performing a chemical mechanical polishing, (CMP), procedure, to remove regions of said HSG silicon layer, and regions of said first polysilicon layer, from the top surface of said second insulator layer, and creating an HSG silicon/polysilicon, crown shaped storage node structure, in said capacitor opening;

performing a post—CMP, wet clean procedure, in a solution of ammonium hydroxide and hydrogen peroxide;

removing said photoresist plug;

performing a dilute hydrofluoric acid, (DHF), procedure, recessing said second insulator layer;

performing a pre-capacitor dielectric formation, wet clean procedure, in a solution comprised of sulfuric acid and hydrogen peroxide;

forming said capacitor dielectric layer on the top surface of said HSG silicon/polysilicon, crown shaped storage node structure;

depositing a second polysilicon layer; and patterning of said second polysilicon layer to create a polysilicon upper plate structure, for said crown shaped capacitor structure, comprised of: overlying, said polysilicon upper plate structure; said capacitor dielectric layer; and underlying, said HSG silicon/polysilicon, crown shaped storage node structure.

10. The method of claim 9, wherein said second insulator layer is a silicon oxide layer, obtained via LPCVD or PECVD procedures, at a thickness between about 9000 to 15000 Angstroms.

11. The method of claim 9, wherein said capacitor opening, in said second insulator layer, is formed via an anisotropic RIE procedure, using $CHF_3$ as an etchant.

12. The method of claim 9, wherein said first polysilicon layer is obtained via LPCVD procedures, to a thickness between about 2000 to 6000 Angstroms, and doped in situ, during deposition, via the addition of arsine, or phosphine, to a silane ambient.

13. The method of claim 9, wherein said post—CMP, wet clean procedure, is performed in a solution comprised of $NH_4OH$ and $H_2O_2$, at a temperature between about 70 to 80° C., for a time between about 1 to 10 min.

14. The method of claim 9, wherein said DHF procedure, is performed in a solution comprised of 1 part of a 50% HF solution, and of 100 parts water, recessing said second insulator layer, to a thickness between about 1000 to 7000 Angstroms.

15. The method of claim 9, wherein said pre-capacitor dielectric formation, wet clean procedure, is performed in a solution comprised of $H_2SO_4$ and $H_2O_2$, at a temperature between about 120 to 180° C., for a time between about 1 to 10 min.

16. The method of claim 9, wherein said capacitor dielectric layer is an ONO, (Oxidized Nitride on Oxide), layer, at an equivalent silicon oxide thickness between about 45 to 55 Angstroms, formed via creation of a silicon oxide layer, on the surface of said HSG silicon layer.

* * * * *